(12) United States Patent
Sun et al.

(10) Patent No.: US 9,865,735 B2
(45) Date of Patent: Jan. 9, 2018

(54) HORIZONTAL GATE ALL AROUND AND FINFET DEVICE ISOLATION

(71) Applicant: Applied Materials, Inc., Santa Clara, CA (US)

(72) Inventors: Shiyu Sun, Santa Clara, CA (US); Naomi Yoshida, Sunnyvale, CA (US); Theresa Kramer Guarini, San Jose, CA (US); Sung Won Jun, San Jose, CA (US); Vanessa Pena, Flemish Brabant (BE); Errol Antonio C. Sanchez, Tracy, CA (US); Benjamin Colombeau, Salem, MA (US); Michael Chudzik, Mountain View, CA (US); Bingxi Wood, Cupertino, CA (US); Nam Sung Kim, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/152,273

(22) Filed: May 11, 2016

(65) Prior Publication Data

US 2016/0336405 A1 Nov. 17, 2016

Related U.S. Application Data

(60) Provisional application No. 62/159,715, filed on May 11, 2015, provisional application No. 62/265,260, filed on Dec. 9, 2015.

(51) Int. Cl.
*H01L 21/00* (2006.01)
*H01L 29/78* (2006.01)
*H01L 29/423* (2006.01)
*H01L 29/786* (2006.01)
*H01L 29/10* (2006.01)
*H01L 29/66* (2006.01)

(52) U.S. Cl.
CPC ........ *H01L 29/785* (2013.01); *H01L 29/1054* (2013.01); *H01L 29/42392* (2013.01); *H01L 29/78642* (2013.01); *H01L 29/66545* (2013.01)

(58) Field of Classification Search
CPC .............. H01L 29/155; H01L 29/1054; H01L 29/78642
See application file for complete search history.

(56) References Cited

U.S. PATENT DOCUMENTS 5,576,221 A    11/1996  Takemura et al.
7,256,142 B2 * 8/2007  Fitzgerald ......... H01L 21/02381
                                                257/E21.129

(Continued)

OTHER PUBLICATIONS

Cheng et al., Bottom oxidation through STI (BOTS)—A Novel Approach to Fabricate Dielectric Isolated FinFETs on Bulk Substrates, 2014 Symposium on VLSITechnology Digest of Technical Papers, 2014 IEEE, 2 pages.

*Primary Examiner* — Laura Menz
(74) *Attorney, Agent, or Firm* — Patterson + Sheridan, LLP

(57) ABSTRACT

Embodiments described herein generally relate to methods and device structures for horizontal gate all around (hGAA) isolation and fin field effect transistor (FinFET) isolation. A superlattice structure comprising different materials arranged in an alternatingly stacked formation may be formed on a substrate. In one embodiment, at least one of the layers of the superlattice structure may be oxidized to form a buried oxide layer adjacent the substrate.

14 Claims, 7 Drawing Sheets

(56) References Cited

U.S. PATENT DOCUMENTS

| | | | |
|---|---|---|---|
| 8,697,501 B1* | 4/2014 | Choi | H01L 29/66795 257/255 |
| 8,735,869 B2* | 5/2014 | Cappellani | B82Y 10/00 257/24 |
| 8,822,282 B2* | 9/2014 | Fitzgerald | H01L 21/02381 438/197 |
| 8,987,794 B2* | 3/2015 | Rachmady | H01L 29/42392 257/288 |
| 9,275,996 B2* | 3/2016 | Mears | H01L 21/324 |
| 9,460,920 B1* | 10/2016 | Sun | H01L 29/66795 |
| 9,484,406 B1* | 11/2016 | Sun | H01L 29/413 |
| 9,673,277 B2* | 6/2017 | Brand | H01L 29/0673 |
| 9,704,995 B1* | 7/2017 | Schultz | H01L 29/7856 |
| 9,748,404 B1* | 8/2017 | Chang | H01L 29/78696 |
| 2002/0123167 A1* | 9/2002 | Fitzgerald | H01L 21/02381 438/47 |
| 2004/0238885 A1 | 12/2004 | Bedell et al. | |
| 2005/0012087 A1* | 1/2005 | Sheu | H01L 21/26533 257/14 |
| 2008/0067499 A1 | 3/2008 | Maa et al. | |
| 2008/0258134 A1* | 10/2008 | Mears | H01L 21/76237 257/15 |
| 2011/0233512 A1* | 9/2011 | Yang | B82Y 10/00 257/9 |
| 2013/0161756 A1* | 6/2013 | Glass | H01L 29/66545 257/369 |
| 2013/0285118 A1* | 10/2013 | Majumdar | H01L 21/02381 257/192 |
| 2014/0241050 A1* | 8/2014 | Nakai | H01L 45/06 365/163 |
| 2015/0028426 A1 | 1/2015 | Ching et al. | |
| 2015/0069327 A1* | 3/2015 | Cheng | H01L 29/158 257/19 |
| 2015/0108430 A1* | 4/2015 | Cheng | H01L 29/66795 257/20 |
| 2015/0144877 A1* | 5/2015 | Mears | H01L 21/324 257/20 |
| 2015/0144878 A1* | 5/2015 | Mears | H01L 21/8238 257/20 |
| 2015/0162447 A1* | 6/2015 | Lee | H01L 29/785 257/19 |
| 2015/0262859 A1 | 9/2015 | Balasubramanian et al. | |
| 2015/0263095 A1* | 9/2015 | Chan | H01L 29/155 257/17 |
| 2016/0099317 A1* | 4/2016 | Mears | H01L 21/324 257/19 |
| 2016/0111495 A1* | 4/2016 | Brand | H01L 29/0673 438/283 |
| 2016/0336405 A1* | 11/2016 | Sun | H01L 29/42392 |
| 2017/0018624 A1* | 1/2017 | Sun | H01L 29/42392 |

* cited by examiner

HORIZONTAL GATE ALL AROUND AND FINFET DEVICE ISOLATION

CROSS-REFERENCE TO RELATED APPLICATIONS

This application claims benefit to U.S. Provisional Patent Application No. 62/159,715, filed May 11, 2015 and to U.S. Provisional Patent Application No. 62/265,260, filed Dec. 9, 2015, both of which are hereby incorporated herein by reference in their entirety.

BACKGROUND

Field

Embodiments of the present disclosure generally relate to semiconductor devices. More specifically, embodiments described herein relate to horizontal gate all around device structures and fin field effect transistor device structures. Further embodiments relate to methods for forming horizontal gate all around device structures and fin field effect transistor device structures.

Description of the Related Art

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate-all-around (hGAA) structure. The hGAA device structure includes several lattice matched channels suspended in a stacked configuration and connected by source/drain regions.

However, challenges associated with hGAA structures include the existence of a parasitic device at the bottom of the stacked lattice matched channels. FinFET structures, which may exhibit different architectures from hGAA structures, also suffer from parasitic leakage and capacitance. Conventional approaches to mitigate the effects of the parasitic device include the implantation of dopants into the parasitic device to suppress leakage of the device. However, a dosage of the dopants required to suppress the leakage may hinder epitaxial growth of device structures on the parasitic device. The dopants may deleteriously diffuse into channels of the device structures during subsequent processing operations, which may result an undesirable increase in device variability. In addition, implantation may not adequately reduce parasitic capacitance. Another conventional approach utilizes thermal oxidation of a highly doped parasitic device. However, thermal oxidation processes generally require temperatures beyond the thermal budgets of the stacked lattice matched channels.

Accordingly, what is needed in the art are improved methods for forming FinFET and hGAA device structures.

SUMMARY

In one embodiment, a device structure is provided. The device structure includes a substrate having a superlattice structure formed thereon. The superlattice structure includes a silicon material layer, a first silicon germanium material layer comprising between about 20% and about 40% germanium, and a second silicon germanium material layer comprising between about 50% and about 80% germanium. The silicon material layer, the first silicon germanium material layer, and the second silicon germanium material layer are disposed in a stacked arrangement.

In another embodiment, a device structure is provided. The device structure includes a superlattice structure which includes a silicon material layer, a first silicon germanium material layer comprising between about 20% and about 40% germanium, and a second silicon germanium material layer comprising between about 50% and about 80% germanium. The silicon material layer, the first silicon germanium material layer, and the second silicon germanium material layer are disposed in a stacked arrangement.

In yet another embodiment, a device structure is provided. The device structure includes a substrate having a superlattice structure formed thereon. The superlattice structure includes one or more silicon material layers, one or more first silicon germanium material layers comprising between about 20% and about 40% germanium, and a buried oxide layer. The silicon material layers, the silicon germanium material layers, and the buried oxide layer are disposed in a stacked arrangement.

In yet another embodiment, a device structure is provided. The device structure includes a superlattice which includes one or more silicon material layers, one or more first silicon germanium material layers comprising between about 20% and about 40% germanium, and a buried oxide layer. The silicon material layers, the silicon germanium material layers, and the buried oxide layer are disposed in a stacked arrangement.

In yet another embodiment, a device structure is provided. The device structure includes a substrate having a superlattice structure formed thereon. The superlattice structure includes one or more silicon material layers, one or more silicon germanium material layers comprising between about 20% and about 40% germanium, and a buried oxide layer. The silicon material layers, the silicon germanium material layers, and the buried oxide layer are disposed in a stacked arrangement. Source/drain regions are formed on the substrate and a metal gate structure is formed over the superlattice structure.

In yet another embodiment, a device structure is provided. The device structure includes a substrate and a buried oxide layer disposed on and in contact with the substrate. A silicon layer or silicon germanium layer comprising between about 20% and about 40% germanium is disposed on the buried oxide layer. Source/drain regions are formed on the substrate and a metal gate structure is formed over the silicon layer or silicon germanium layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to methods and device structures for horizontal gate all around (hGAA) isolation and fin field effect transistor (FinFET) isolation. A superlattice structure comprising different materials arranged in an alternatingly stacked formation may be formed on a substrate. In one embodiment, at least one of the layers of the superlattice structure are oxidized to form a buried oxide layer adjacent the substrate.

In one example, the superlattice structure includes one or more silicon containing material layers and one or more silicon germanium (SiGe) containing material layers disposed in an alternating stacked arrangement. At least one of the SiGe layers has a higher germanium content when compared to other SiGe layers in the superlattice structure. The higher germanium content SiGe layer is oxidized to form a buried oxide layer to provide for improved device isolation in an hGAA or FinFET architecture. As a result, a substantially defect free stacked channel structure which can provide a geometric benefit in the current density per square micrometer of surface area on a substrate may be achieved. Accordingly, circuit density may be increased, parasitic leakage and capacitance may be reduced, and power consumption of the device may be reduced.

Figure 1:
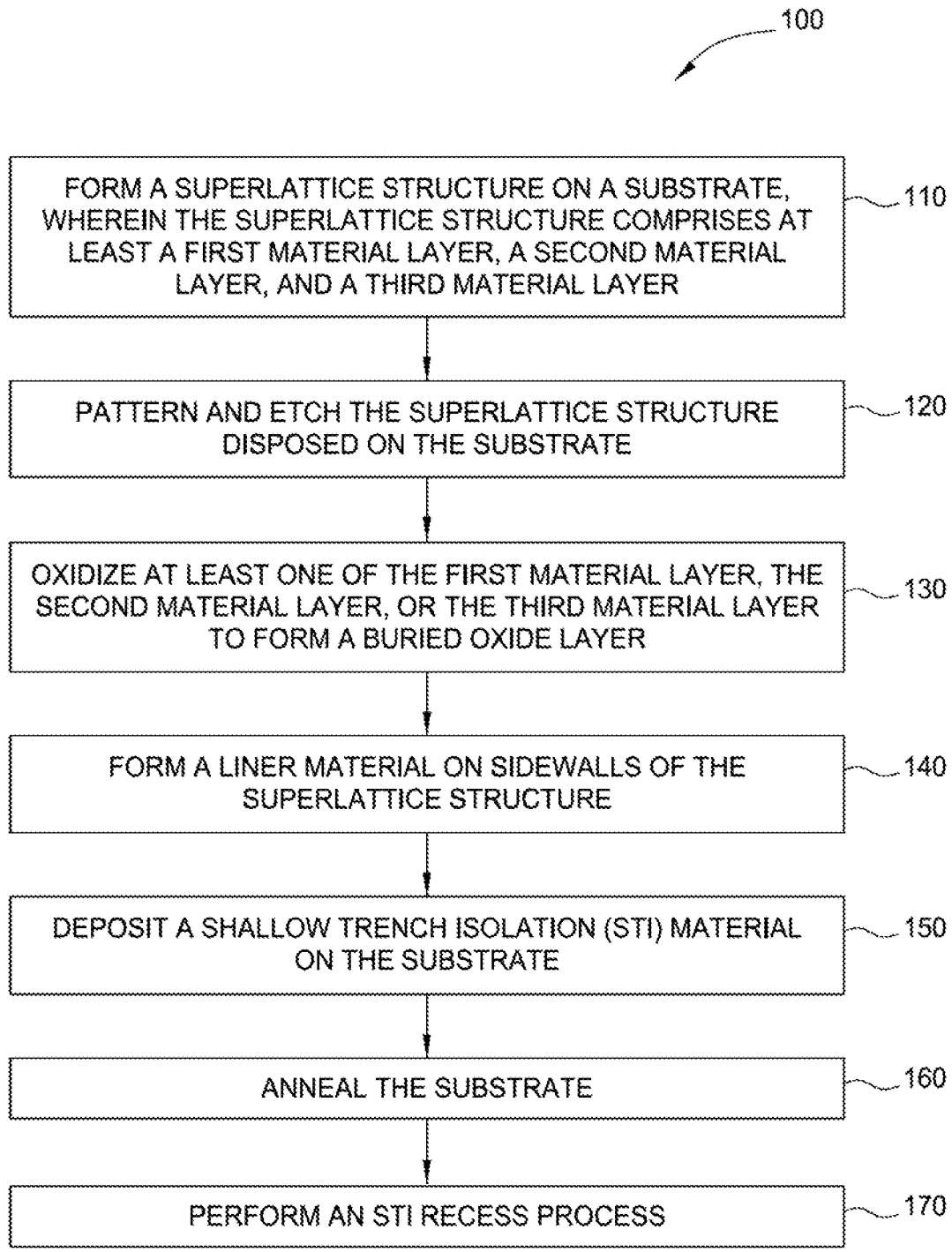
FIG. 1 illustrates operations of a method for forming a buried oxide material in a device structure.

FIG. 1 illustrates operations of a method 100 for forming a buried oxide material in an hGAA or FinFET structure. The method 100 may be part of a multi-operation fabrication process of a semiconductor device, for example, an hGAA or FinFET device. At operation 110, a superlattice structure is formed on a substrate. The term superlattice, as utilized herein, generally refers to a stack of material layers which are closely lattice matched materials, but are sufficiently different in composition that selective removal processes can be performed on the superlattice structure. More generally, the composition of various material layers in the stack may be unique to one or more of the materials layers in the stack. In one example, the superlattice structure includes one or more layers of a silicon containing material and a silicon germanium containing material. In one embodiment, the superlattice structure includes a first material layer and a second material layer. In another embodiment, the superlattice structure includes a first material layer, a second material layer, and a third material layer. In this embodiment, the second material layer and the third material layer are formed from the same compound material, but may have different material properties.

At operation 120, the superlattice structure is patterned and etched. At operation 130, at least one of the first material layer, the second material layer, or the third material layer are oxidized to form a buried oxide (BOX) layer. In one example, the second material layer and the third material layer are oxidized. In another example, the third material layer is oxidized.

At operation 140, a liner material is formed on sidewalls of the superlattice structure. In one embodiment, the liner material is deposited, for example, by a chemical vapor deposition, an atomic layer deposition, or epitaxial deposition process. In another embodiment, the liner material is formed (i.e. grown) by suitable processes, such as thermal oxidation or thermal nitridation processes. The liner material is generally configured to repair portions of the superlattice structure which may be damaged during previous etching processes. The liner material may also prevent or reduce oxidation of material layers in the superlattice structure during subsequent processing operations.

In one embodiment, the liner material is an oxide material, a nitride material, or an oxynitride material. For example, the liner material may be a $SiO_2$ material, a SiN material, or a SiON material. In other embodiments, the liner material contains carbon and/or boron. For example, the liner material may be a SiCN material, a SiOCN material, a SiBN material, a SiOBN material, and/or a SiOBCN material. In another embodiment, the liner material is a phosphosilicate glass (PSG), a borosilicate glass (BSG), or doped glass material. It is contemplated that the various aforementioned liner materials may be doped in certain embodiments.

At operation 150, a shallow trench isolation (STI) material is deposited on the substrate. In one embodiment, the STI material is an oxide material, such as $SiO_2$ or the like. Generally, the oxide material is formed over and around the superlattice structure. In one embodiment, the oxide material is deposited by a flowable chemical vapor deposition (CVD) process.

At operation 160, an annealing process is performed on the substrate. In one embodiment, the annealing process includes a steam annealing process. In another embodiment, the annealing process includes a steam annealing process and a dry annealing process. In yet another embodiment, the annealing process includes a dry annealing process (i.e. no steam). Generally, the annealing process provides for improved densification of the STI material which may improve isolation of features formed on the substrate.

At operation 170, an STI recess process is performed. Generally, the STI material is etched to expose a portion of the superlattice. In one embodiment, the STI material is recessed such that the STI material is co-planar with the BOX layer. STI planarization may also be performed prior to the STI recess process. A more detailed description of the method 100 is provided in the description of FIGS. 2-7, which illustrate various stages of fabrication of a semiconductor device.

Figure 2:
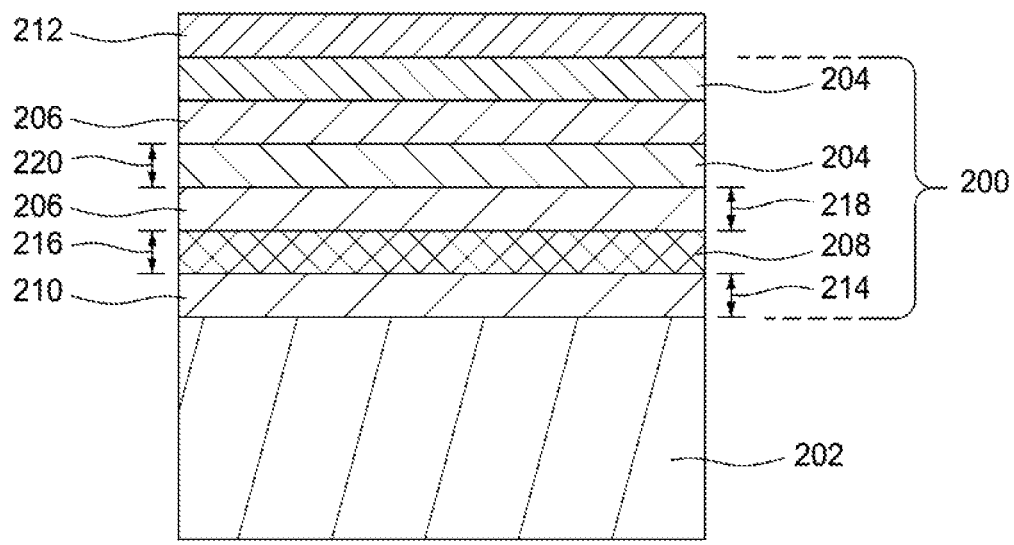
FIG. 2 illustrates a schematic, cross-sectional view of a portion of a substrate having a superlattice structure formed thereon.

FIG. 2 illustrates a schematic, cross-sectional view of a portion of a substrate 202 having a superlattice structure 200 formed thereon. In one embodiment, the substrate 202 is a bulk semiconductor substrate. The term bulk semiconductor substrate refers to a substrate in which the entirety of the substrate is comprised of a semiconductor material. The bulk semiconductor substrate includes any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon substrates, patterned or non-patterned substrates, doped silicon, germanium, gallium arsenide, or other suitable semiconducting materials. In one embodiments, the semiconductor material is silicon. In other embodiments, the semiconductor material is a doped material, such as n-doped silicon (n-Si), or p-doped silicon (p-Si).

The superlattice structure 200 includes a plurality of first layers 204 and a corresponding plurality of second layers 206 alternatingly arranged in a plurality of stacked pairs. In one embodiment, the plurality of first layers 204 are formed from a silicon containing material. In one embodiment, the plurality of second layers 206 are formed from at least a silicon containing material and a germanium containing material. Accordingly, the first layers 204 and the second layers 206 are different materials. In some embodiments, the plurality of first layers 204 and corresponding plurality of second layers 206 are lattice matched materials with a sufficient difference in composition such that selective layer removal or selective oxidation can subsequently be performed.

In certain embodiments, the plurality of first layers 204 include Group IV materials, such as silicon. The plurality of second layers 206 include Group IV materials, such as silicon germanium (SiGe). In other embodiments, the plurality of first layers 204 and the plurality of second layers 206 include various III-V materials, such as indium-phosphorus (InP) and indium-gallium-phosphorus (InGaP), respectively. In some embodiments, the plurality of first layers 204 and the plurality of second layers 206 are multiple pairs of lattice matched materials. In some embodiments, the plurality of first layers 204 and corresponding plurality of second layers 206 may be any number of lattice matched material pairs suitable for forming the superlattice structure 200. For example, the plurality of first layers 204 and corresponding plurality of second layers 206 include between about 2 to about 5 pairs of lattice matched materials.

Material layer 210 and material layer 208 are included the in the plurality of second layers in one embodiment. Alternatively, material layer 208 may be considered a third material layer. Material layers 210 and 208 are formed from the same material as the plurality of second layers 206, such as silicon germanium. However, it is contemplated that the compositional profile of the material layers 210 and 208 may differ in molar ratio of Si:Ge.

In one example, the plurality of first layers 204 and the material layer 210 have a silicon:germanium molar ratio of between about 1:1 and about 5:1. In one embodiment, the silicon germanium material of the plurality of first layers 204 and the material layer 210 has a germanium content of between about 10% and about 50%, such as between about 20% and about 40%. The silicon content is between about 30% and about 90%, such as between about 50% and about 80%, for example, about 70%. Alternatively, the plurality of first layers 204 may be formed from a pure silicon material. In another example, the material layer 208 has a silicon:germanium molar ratio of between about 1:1 and about 1:5. In one embodiment, the silicon germanium material of the material layer 208 has a germanium content of between about 20% and about 100%, such as between about 50% and about 80%. The silicon content is between about 0% and about 80%, such as between about 20% and about 40%.

The plurality of first layers 204, the plurality of second layers 206, and the material layers 210, 208 are deposited using an epitaxial chemical vapor deposition process. Suitable precursors for forming the plurality of first layers 204, the plurality of second layers 206, and the material layers 210, 208 include $SiH_4$ and $GeH_4$, among others. In certain embodiments, the plurality of first layers 204 and the plurality of second layers 206 are deposited at a sufficiently low temperature, for example between about 300 degrees Celsius to about 750 degrees Celsius, to prevent intermixing of the different atomic species. As a result, interfaces between the different atomic species may be controlled which provides advantageous control of the structure during selective etching or modification processes, such as oxidation processes.

The material layers of the superlattice structure 200 may have controlled thicknesses to provide for substantially defect free crystallographic profiles of the various materials. In one embodiments, the layers of the superlattice structure 200 have a thickness of between about 3 nm and about 50 nm. For example, the plurality of first layers 204 have a thickness 220 between about 3 nm and about 10 nm, such as between about 5 nm and 7 nm, for example, about 6 nm. The plurality of second layers 206 have a thickness 218 of between about 5 nm and about 15 nm, such as between about 7 nm and about 10 nm, for example, about 8 nm. The material layer 210 has a thickness 214 of between about 5 nm and about 15 nm, such as between about 8 nm and about 12 nm, for example, about 10 nm. The material layer 208 has a thickness 216 if between about 5 nm and about 15 nm, such as between about 8 nm and about 12 nm, for example, about 10 nm.

During formation of the superlattice structure 200 on the substrate 202, the various material layers are deposited in certain sequences to manufacture one or more devices within the superlattice structure 200. In one embodiment, the material layer 210 is disposed on the substrate 202 and the material layer 208 is disposed on the material layer 210. In another embodiment, the material layer 210 may be optional, such that the material layer 208 is disposed on the substrate 202.

The plurality of second layers 206 and the plurality of first layers 204 are deposited in an alternating arrangement to form a stacked structure. In this embodiment, one of the second layers 206 is disposed on the material layer 208 and one of the first layers 204 is disposed on the one of the second layers 206. A hardmask layer 212 may also be disposed on the superlattice structure 200. In one embodiment, the hardmask layer 212 is disposed on one of the first layers 204. The hardmask layer 212 may be any suitable hardmask material, such as a silicon nitride material or the like.

Figure 3:
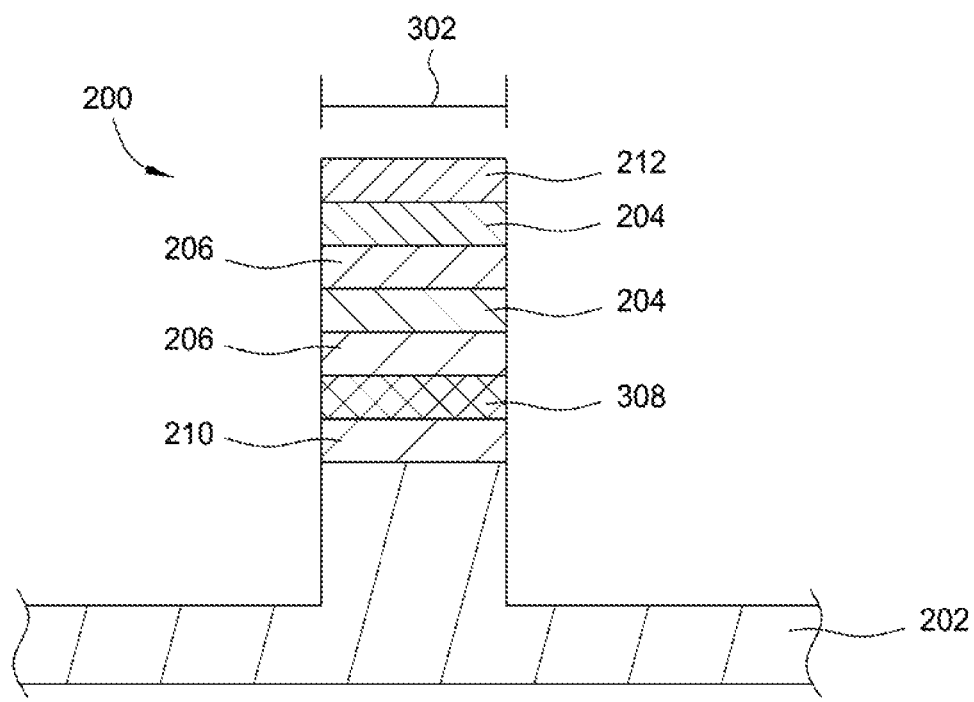
FIG. 3 illustrates a schematic, cross-sectional view of a portion of the substrate and superlattice structure of FIG. 2 after patterning, etching, and buried oxide layer formation processes are performed.

FIG. 3 illustrates a schematic, cross-sectional view of a portion of the substrate 202 and superlattice structure 200 of FIG. 2 after patterning, etching, and oxidation processes are performed. In one embodiment, photolithography processes, such as extreme ultraviolet patterning processes, is utilized to pattern the substrate 202 and the superlattice structure 200. In another embodiment, self-aligned double or quadruple patterning processes is utilized to pattern the substrate 202 and the superlattice structure 200. The patterning processes may be configured to enable formation of the superlattice structure 200 after an etching process with a channel width 302 of between about 5 nm and about 15 nm, for example, between about 7 nm and about 10 nm.

Exemplary etching processes which may be utilized to etch the substrate 202 and the superlattice structure 200 reactive ion etching (RIE) processes or the like. In one embodiment, an RIE process is performed utilizing a chlorine, bromine, or fluorine based chemistry to anisotropically etch the substrate 202 and the superlattice structure 200.

The superlattice structure 200 formed on the substrate 202 is also subjected to an oxidation process. The oxidation process selectively oxidizes one or more of the various material layers of the superlattice structure 200. Suitable oxidation processes include decoupled plasma oxidation processes, remote plasma oxidation processes, ultraviolet ozone oxidation processes, and radical oxidation processes. For example, the oxidation process selectively oxidizes the material layer 208. The oxidation process may be configured such that the relatively low germanium content layers, for example, the material layer 210 and the plurality of second layers 206, are not oxidized during the oxidation process while providing for oxidation of relatively high germanium content layers, such as the material layer 208. After selective oxidation, the material layer 208 is transformed into a buried oxide (BOX) layer 308. In one embodiment, oxidation of the material layer 208 to form the BOX layer 308 also includes oxidation of the material layer 210 as a result of the material layer's proximity to the material layer 208. However, in this embodiment, the plurality of second layers 206 remain substantially unoxidized.

In one embodiment, a radical oxidation process is utilized to form the BOX layer 308. The radical oxidation process generally exposes a desired material to oxygen radicals to selectively oxidize a desired material layer. The substrate 202 and superlattice structure 200 are disposed in a processing environment configured for performing a radical oxidation process. A temperature of the radical oxidation process is between about 500° C. and about 900° C., such as between about 600° C. and about 800° C., for example, about 700° C. The radical oxidation process is performed at a pressure of between about 1 milliTorr and about 760 Torr, such as between about 1 Torr and about 100 Torr, for example, about 7 Torr. The radical oxidation process may be performed for an amount of time sufficient to oxidize the high germanium content material layers. In one embodiment, the radical oxidation process is performed for an amount of time between about 1 second and about 60 seconds, such as between about 10 seconds and about 30 seconds, for example, about 20 seconds.

Precursors provided to the processing environment during the radical oxidation process include oxygen containing precursors and hydrogen containing precursors. In one embodiment, $O_2$ and $H_2$ are utilized in a ratio of between about 50:1 ($O_2$: $H_2$) to about 150:1, such as between about 90:1 and about 110:1, for example, about 100:1. In this embodiment, $O_2$ is provided at a flow rate of between about 10 slm and about 100 slm, such as between about 15 slm and about 30 slm, for example about between about 19 slm and about 20 slm. $H_2$ is provided at a flow rate of between about 0.1 slm, and about 1.0 slm, such as about 0.2 slm. In the aforementioned embodiments, the processing environment is configured for performing radical oxidation processes on 300 mm substrates.

Utilizing a radical oxidation process according to the aforementioned embodiments oxidizes approximately 1 nm of material per second. For example, if the material layer 208 has a channel width 302 of about 40 nm, the oxidation process is performed for about 20 seconds. It is believed that oxidation of the material layer 208 proceeds from sidewalls of the material layer 208 inward. Therefore, the oxidation time (t) to form the BOX layer 308 (utilizing suitable processing parameters) may generally be defined as t=n/2, where n is the channel width 302. By performing selective oxidation to form the BOX layer 308 prior to subsequent processing operations, efficiencies in processing may be realized. For example, the amount of time utilized to fully oxidize the BOX layer 308 may be reduced. Moreover, improved oxidation selectivity may be realized as there are fewer materials and structures to select from when compared to oxidation processes performed during subsequent processing operations. In addition, the BOX layer formation process may be performed without capping layers required in various conventional processes.

Figure 4:
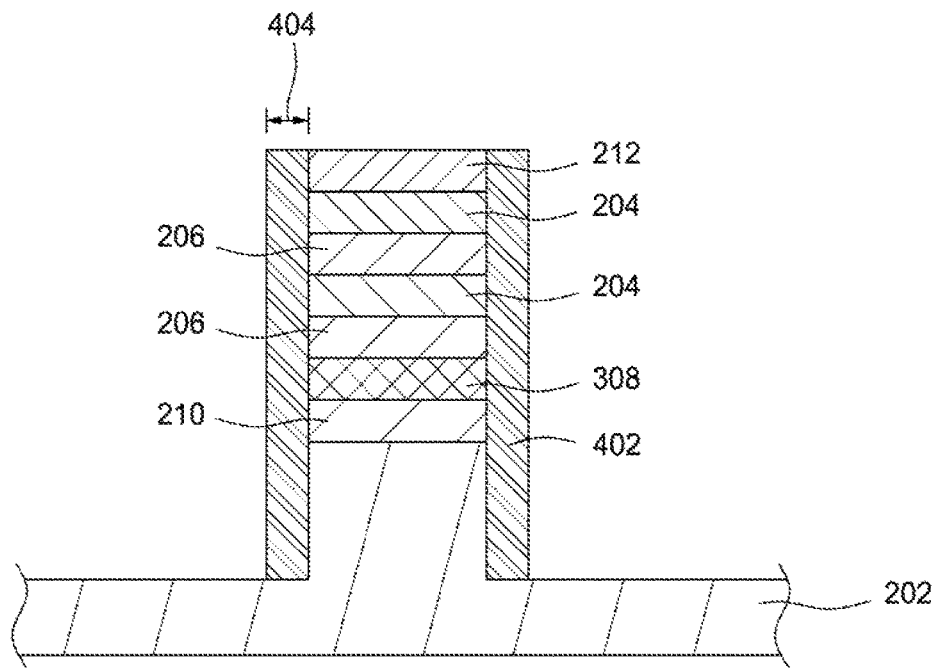
FIG. 4 illustrates a schematic, cross-sectional view of a portion of the substrate and superlattice structure of FIG. 3 after a liner formation process is performed.

FIG. 4 illustrates a schematic, cross-sectional view of a portion of the substrate 202 and superlattice structure 200 of FIG. 3 after a liner formation process is performed. During the previously described etching process, sidewalls of the superlattice structure 200 may be damaged. A liner deposition process is performed to deposit a liner material 402 on sidewalls of the superlattice structure 200 and at least a portion of the substrate 202.

The liner material deposition process includes several distinct operations to manufacture the liner material 402. For example, a thermal oxidation process is performed to deposit an oxide material on sidewalls of the superlattice structure 200, which includes the BOX layer 308, and the substrate 202. Subsequently, a nitridation process, such as a decoupled plasma nitridation process, is performed to incorporate nitrogen in the oxide material to form an oxynitride material. The oxynitride liner material 402 is then subjected to a post-nitridation annealing process to further incorporate the nitrogen into the oxide material. The post-nitridation annealing process may also cure defects that may exist in the liner material 402.

In one embodiment, a width 404 of the liner material 402 is between about 5 Å and about 50 Å, such as between about 20 Å and about 30 Å, for example, about 25 Å. It is contemplated that the liner material 402 may be suitable for preventing oxidation of unoxidized material layers of the superlattice structure 200 during a subsequent shallow trench isolation process.

Figure 5:
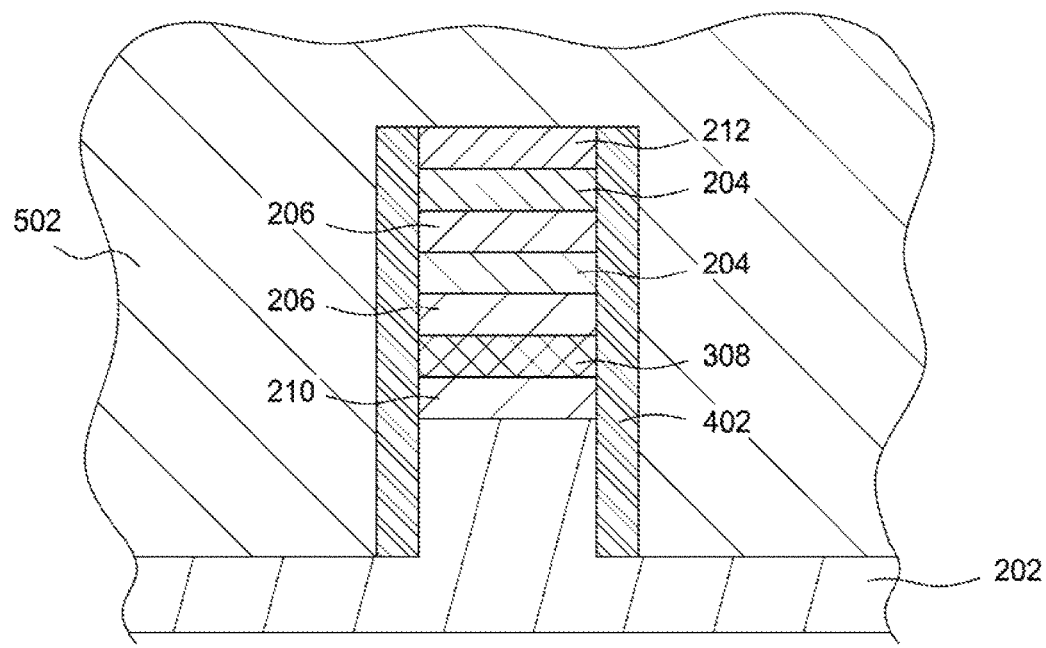
FIG. 5 illustrates a schematic, cross-sectional view of a portion of the substrate and superlattice structure of FIG. 4 after a shallow trench isolation (STI) process is performed.

FIG. 5 illustrates a schematic, cross-sectional view of a portion of the substrate 202 and superlattice structure 200 of FIG. 4 after a shallow trench isolation (STI) process is performed. The STI process is generally performed to electrically isolate at least one of the substrate 202 and/or the superlattice structure 200 from wells having different conductivity types (e.g., n-type or p-type) and/or adjacent transistor features (not shown) on the substrate 202. In one embodiment, the STI process is a flowable CVD deposition process configured to deposit a dielectric material layer 502, such as a silicon oxide material or a silicon nitride material. The dielectric material layer 502 is formed using a high-density plasma CVD system, a plasma enhanced CVD system, and/or a sub-atmospheric CVD system, among other systems. Examples of CVD systems that may be adapted to form the dielectric material layer 502 include the ULTIMA HDP CVD® system and PRODUCER® ETERNA CVD® system, both available from Applied Materials, Inc., of Santa Clara, Calif. It is contemplated that other suitably configured CVD systems from other manufacturers may also be utilized.

Figure 6:
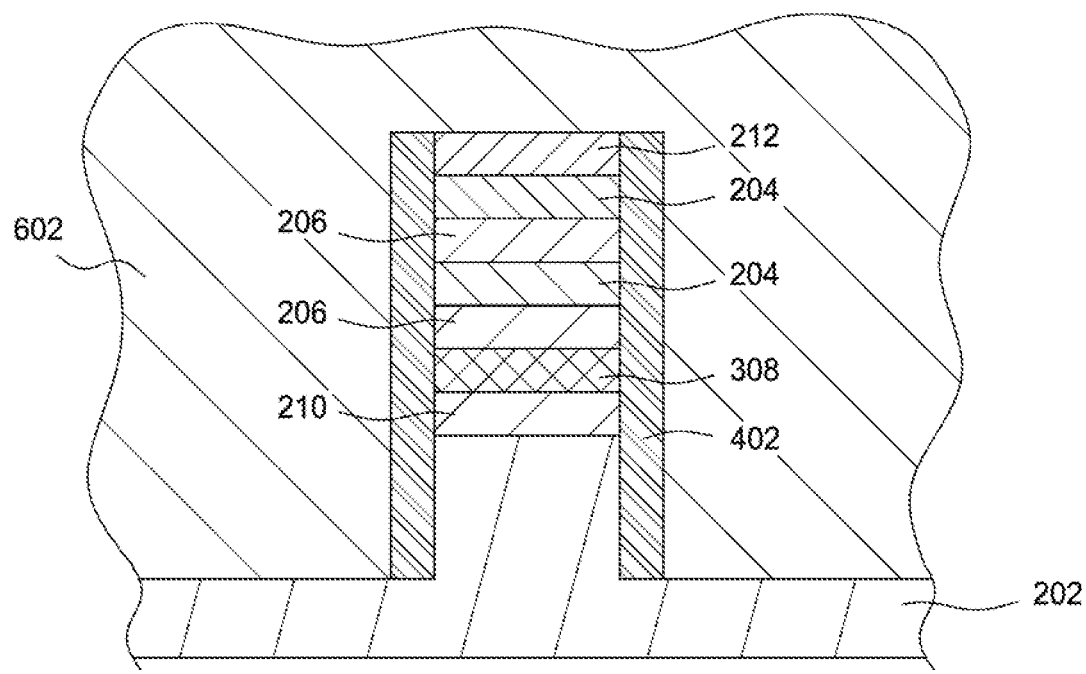
FIG. 6 illustrates a schematic, cross-sectional view of a portion of the substrate and superlattice structure of FIG. 5 after an annealing process is performed.

FIG. 6 illustrates a schematic, cross-sectional view of a portion of the substrate 202 and superlattice structure 200 of FIG. 5 after an annealing process is performed. The annealing process is performed to densify the dielectric material layer 502 to form a densified dielectric material layer 602.

In one embodiment, the annealing process includes a steam annealing process. The steam annealing process is performed at a temperature of between about 300 degrees Celsius and about 800 degrees Celsius, such as between about 500 degrees Celsius and about 600 degrees Celsius. The steam annealing process is performed for an amount of time between about 15 minutes and about 180 minutes, for example, about 120 minutes. The steam annealing process may also further oxidize the densified dielectric material layer 602.

In another embodiment, the annealing process also includes a dry annealing process. The dry annealing process is performed at a temperature of between about 500 degrees Celsius and about 1000 degrees Celsius, such as between about 650 degrees Celsius and about 750 degrees Celsius. The dry annealing process is performed for an amount of time between about 1 minute and about 60 minutes, for example, about 30 minutes. In yet another embodiment, both the steam annealing process and the dry annealing process are utilized together. In this embodiment, the dry annealing process is performed after the steam annealing process.

After the one or more annealing processes are performed, the substrate 202 is planarized. More specifically, the densified dielectric material layer 602 may be polished, etched, or otherwise modified such that a top surface of the densified dielectric material layer 602 is substantially co-planar with the hardmask layer 212. In one embodiment, the hardmask layer 212 is utilized as a stop indicator for a chemical mechanical polishing process. In one embodiment, the hardmask layer 212 is removed from the superlattice structure 200 after planarization of the densified dielectric material layer 602.

Figure 7:
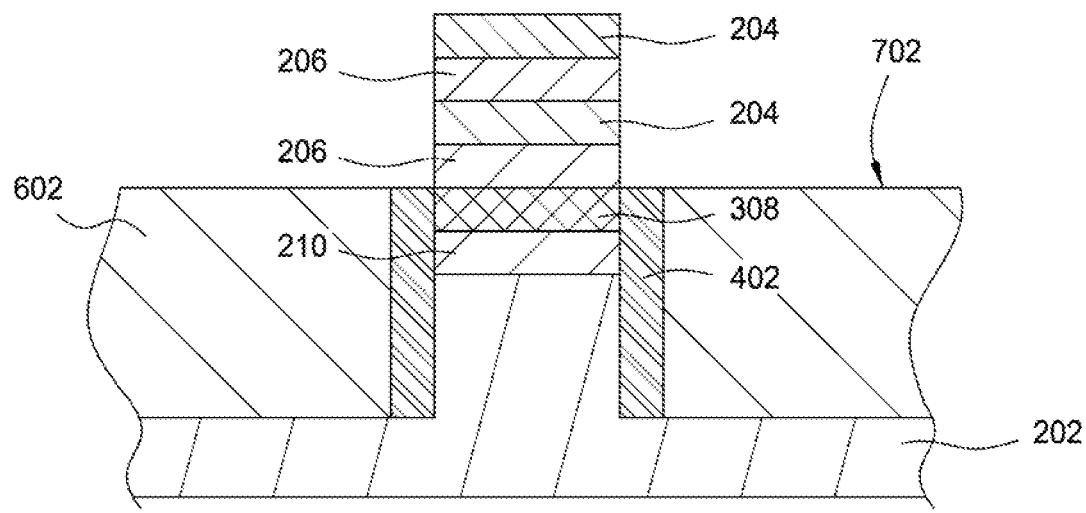
FIG. 7 illustrates a schematic, cross-sectional view of a portion of the substrate and superlattice structure of FIG. 6 after an STI recess process is performed.

FIG. 7 illustrates a schematic, cross-sectional view of a portion of the substrate 202 and superlattice structure 200 of FIG. 6 after an STI recess process is performed. The STI recess process is generally an etching process configured to remove at least a portion of the densified dielectric material layer 602. In one embodiment, a top surface 702 of the densified dielectric material layer 602 is removed such that the top surface 702 is substantially co-planar with the BOX layer 308 or with an interface between the BOX layer 308 at one of the plurality of second layers 206. The STI recess process also removes a portion of the liner material 402. In one embodiment, the STI recess process is a remote plasma assisted dry etching process which exposes various materials disposed on the substrate 202 to $H_2$, $NF_3$, and $NH_3$ plasma by-products. The STI recess process is generally a conformal removal process and is selective to silicon oxide materials but does not readily etch silicon. For example, the removal rate of the BOX layer 308 may be less than the removal rate of the densified dielectric material layer 602. The existence of the liner material 402 may further reduce or prevent etching of the BOX layer 308 during the STI recess process. Accordingly, over etching or undercutting of the BOX layer 308 may be reduced or eliminated during etching of the densified dielectric material layer 602. In one embodiment, the STI recess process is performed by a SICONI® process and suitably configured apparatus, available from Applied Materials, Inc., Santa Clara, Calif. It is contemplated that other suitable etching processes and apparatus may also be utilized to perform the STI recess process.

After performing the STI recess process, subsequent hGAA or FinFET processing operations may be performed. Advantageously, the BOX layer 308 is self-aligned to a bottom region of the superlattice structure 200. The self-aligned BOX formation process described herein advantageously improves transistor device performance and reduces transistor device variability by reducing or eliminating parasitic capacitance and leakage. In addition, processing flexibility and efficiency of BOX layer formation may be realized by forming the BOX layer 308 prior to depositing the dielectric material layer 502 or by forming the BOX layer 308 after deposition of the dielectric material layer 502.

Figure 8:
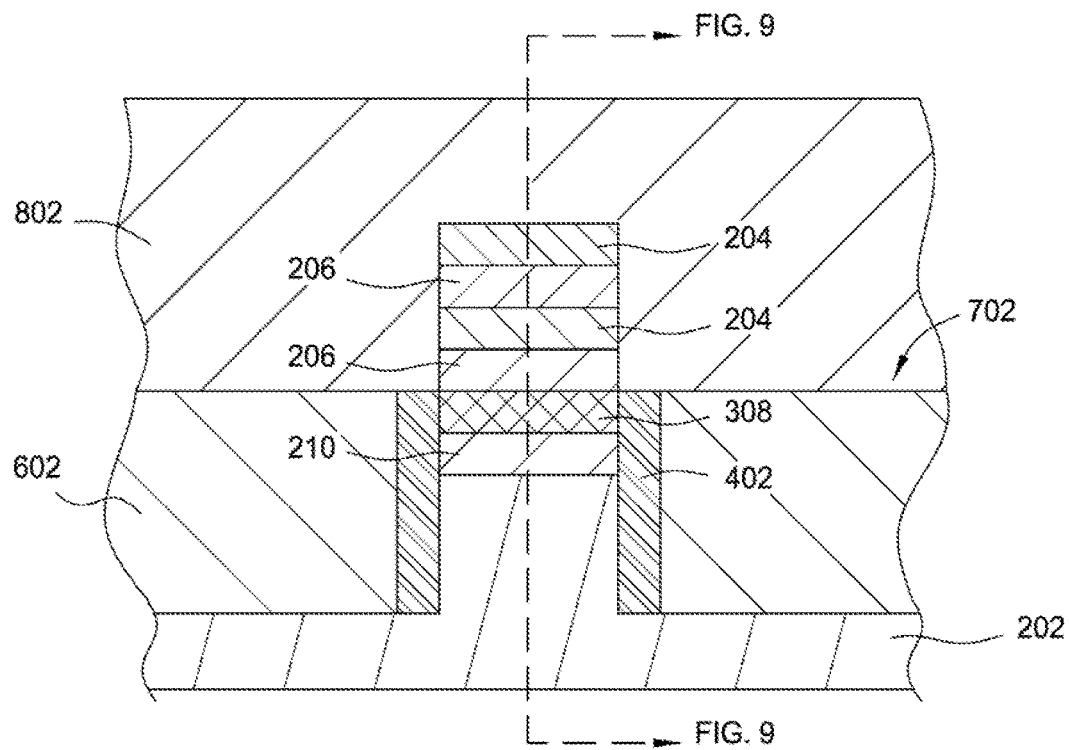
FIG. 8 illustrates a schematic, cross-sectional view of a portion of the substrate and superlattice structure of FIG. 7 after formation of a dummy gate structure.

Subsequent processing operations for forming hGAA and FinFET device structures generally include gate structure formation and source/drain formation. FIG. 8 illustrates a schematic, cross-sectional view of the substrate 202 and superlattice structure 200 with a dummy gate structure 802 formed thereon. The dummy gate structure 802 is formed from one or more materials suitable for utilization as a placeholder for subsequent replacement metal gate formation. In one embodiment, the dummy gate structure 802 is formed from a silicon containing material, such as amorphous silicon or the like.

Figure 9:
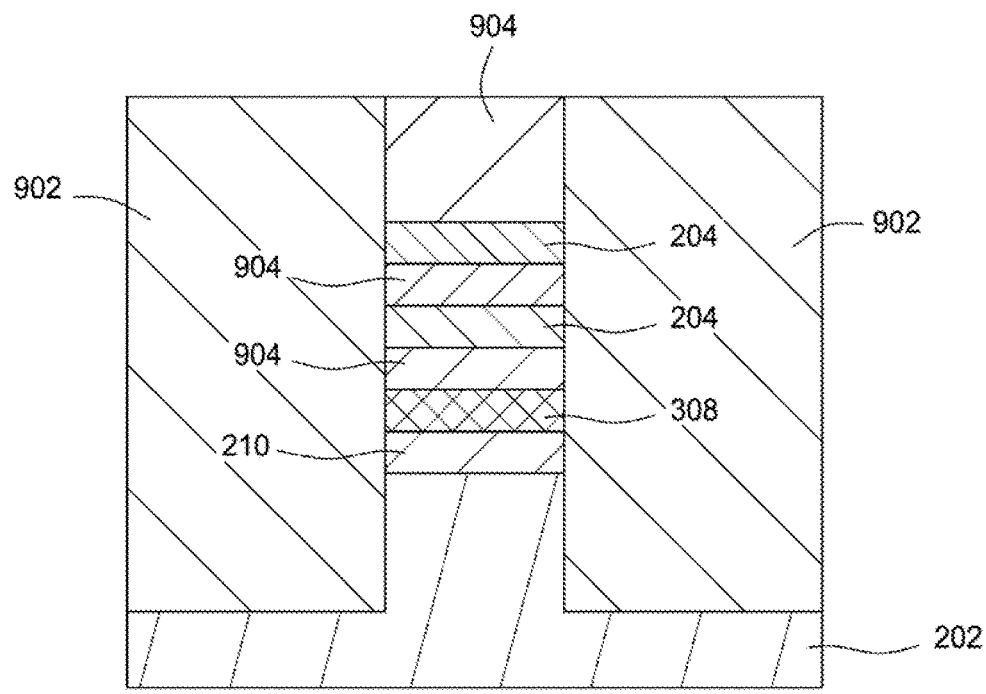
FIG. 9 illustrates a schematic, cross-sectional view of FIG. 8 rotated 90° depicting source and drain regions formed on the substrate adjacent the superlattice structure.

FIG. 9 illustrates a schematic, cross-sectional view of FIG. 8 rotated 90° along section line 9-9 depicting source/drain regions 902 formed on the substrate 202 adjacent the superlattice structure 200. The source/drain regions 902 are generally deposited on the substrate 202 such that the source/drain regions 902 couple with the superlattice structure 200 (which may function as a channel) and facilitate the flow of electrons and holes therebetween.

The source/drain regions 902 are formed from suitable materials, such as silicon containing materials, doped silicon materials, compound silicon materials, or non-silicon containing materials. For example, the source/drain regions 902 may be silicon, phosphorous doped silicon, silicon germanium materials, or germanium. It is contemplated that the type of source/drain region material is selected in response to desired n-type or p-type characteristics of the source/drain regions 902. The source/drain regions 902 are deposited by suitable deposition techniques, such as CVD techniques or epitaxial deposition techniques.

In one embodiment, such as hGAA integration schemes, the plurality of second layers 206 and the dummy gate structure 802 are replaced by a metal gate structure 904. The plurality of second layers 206 and the dummy gate structure 802, which exhibit sufficiently different compositional profiles to other layers of the superlattice structure 200, are removed by selective etching processes. In certain embodiments, the dummy gate structure 802 is removed by a first etching process selective to the material of the dummy gate structure 802 and the plurality of second layers 206 are removed by a second etching process selective to the material of the second layers 206. Alternatively, the dummy gate structure 802 and the plurality of second layers 206 are removed by a single etching process. Although not illustrated, in certain embodiments, a spacer material is disposed between the source/drain regions 902 and the metal gate structure 904. In this embodiment, deposition of the spacer material is performed prior to deposition of the source/drain regions 902.

Subsequently, the metal gate structure 904 is deposited in regions previously occupied by the dummy gate structure 802 and the plurality of second layers 206. Generally, the metal gate structure 904 may be deposited by suitably configured epitaxial processes, atomic layer deposition (ALD) processes, or CVD processes. Materials utilized for the metal gate structure 904 generally exhibit a k-value of greater than about 3.9. Examples of materials with suitably high k values include hafnium dioxide, zirconium dioxide, titanium dioxide, titanium nitride, and titanium aluminide, among others. Various other nitride materials are utilized in certain embodiments. In one embodiment, the materials described above are utilized for portions of the metal gate structure 904 which replace the plurality of second layers 206.

A portion of the metal gate structure 904 which replaces the dummy gate structure 802 is formed from a metal containing material and/or a conductive material. For example, suitable materials include titanium containing materials, such as TiN or TiAlC, and tantalum containing materials, such as TaN. Other suitable materials include refractory metals, such as tungsten, ruthenium, rhenium, and the like. In certain embodiments, materials utilized to form regions of the metal gate structure 904 which replace the plurality of second layers 206 and the dummy gate structure 802 are the same materials or different materials as described above. The types of materials selected for the metal gate structure 904 may be determined by the transistor type (i.e. NMOS/PMOS).

In one embodiment, if the BOX layer 308 has not been previously oxidized, an oxidation process is performed during and/or after formation of the source/drain regions 902. Accordingly, process flexibility in forming the BOX layer 308 is improved which may provide for more efficient BOX layer formation and improved device performance, depending on the desired integration scheme. It is contemplated that hGAA and FinFET processing sequences, among others, can derive benefits from implementing the above described BOX layer formation schemes (i.e. BOX layer 308 formed before deposition of dielectric material layer 502 or BOX layer 308 formed after deposition of dielectric material layer 502).

Figure 10:
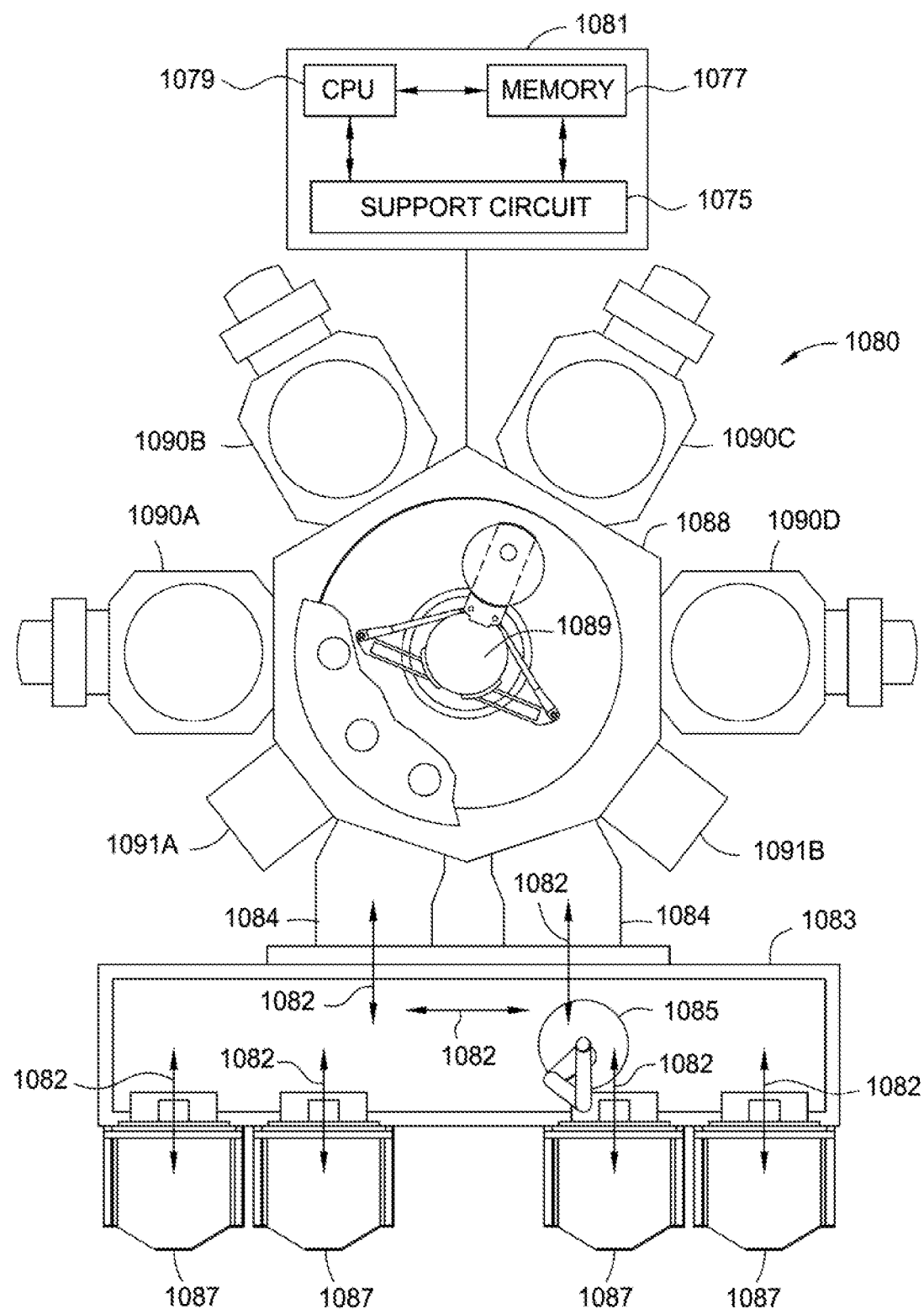
FIG. 10 illustrates a cluster tool which may be utilized in accordance with one or more of the embodiments described herein.

FIG. 10 illustrates a schematic, plan view of a cluster tool 1080 suitable for performing one or more portions of the present disclosure. Generally, the cluster tool 1080 is a modular system comprising multiple chambers (e.g., process chambers 1090A-D, service chambers 1091A-B, or the like) which perform various functions, including: substrate center-finding and orientation, degassing, annealing, deposition and/or etching.

The cluster tool 1080 includes at least a semiconductor substrate process chamber configured to perform at least portions of the method 100 and may further include chambers such as ion implantation chambers, etch chambers, deposition chambers and the like. The multiple chambers of the cluster tool 1080 are mounted to a central vacuum transfer chamber 1088 which houses a robot 1089 adapted to shuttle substrates between the chambers. The vacuum transfer chamber 1088 is typically maintained at a vacuum condition and provides an intermediate stage for shuttling substrates from one chamber to another and/or to a load lock chamber 1084 positioned at a front end of the cluster tool 1080. A front-end environment 1083 is shown positioned in selective communication with the load lock chambers 1084. A pod loader 1085 disposed in the front-end environment 1083 is capable of linear and rotational movement (arrows 1082) to shuttle cassettes of substrates between the load lock chambers 1084 and a plurality of pods 1087 which are mounted on the front-end environment 1083.

The cluster tool 1080 also includes a controller 1081 programmed to carry out the various processing methods performed in the cluster tool 1080. For example, the controller 1081 is configured to control flow of various precursor and process gases from gas sources and control processing parameters associated with material deposition or etching processes. The controller 1081 includes a programmable central processing unit (CPU) 1079 that is operable with a memory 1077 and a mass storage device, an input control unit, and a display unit (not shown), such as power supplies, clocks, cache, input/output (I/O) circuits, and the like, coupled to the various components of the cluster tool 1080 to facilitate control of the substrate processing. The controller 1081 also includes hardware for monitoring substrate processing through sensors in the cluster tool 1080. Other sensors that measure system parameters such as substrate temperature, chamber atmosphere pressure and the like, may also provide information to the controller 1081.

To facilitate control of the cluster tool 1080 described above, the CPU 1079 may be one of any form of general purpose computer processor that can be used in an industrial setting, such as a programmable logic controller (PLC), for controlling various chambers and sub-processors. The memory 1077 is coupled to the CPU 1079 and the memory 1077 is non-transitory and may be one or more of readily available memory such as random access memory (RAM), read only memory (ROM), floppy disk drive, hard disk, or any other form of digital storage, local or remote. Support circuits 1075 are coupled to the CPU 1079 for supporting the processor in a conventional manner. Deposition, etching, and other processes are generally stored in the memory 1077, typically as a software routine. The software routine may also be stored and/or executed by a second CPU (not shown) that is remotely located from the hardware being controlled by the CPU 1079.

The memory 1077 is in the form of computer-readable storage media that contains instructions, that when executed by the CPU 1079, facilitates the operation of the cluster tool 1080. The instructions in the memory 1077 are in the form of a program product such as a program that implements the method of the present disclosure. The program code may conform to any one of a number of different programming languages. In one example, the disclosure is implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

For the purposes of practicing embodiments of the present disclosure, at least one of the processing chambers (for example, 1090A) of the cluster tool 1080 is configured to perform an etch process, a second processing chamber (for example 1090B) is configured to perform a cleaning process and a third processing chamber (for example 1090C) is configured to perform a epitaxial deposition process. A cluster tool having the recited configuration may advantageously prevent unwanted oxidation after the source/drain recess is etched and reduces or eliminates subsequent cleaning of oxidized surfaces prior to epitaxial deposition. In some embodiments, at least one of the processing chambers (for example, 1090A) of the cluster tool 1080 is configured to perform a selective etch process, and a second processing chamber (for example 1090B) is configured to perform a deposition process, for example, deposition of a dielectric material. A cluster tool having the recited configuration may advantageously prevent oxidation of the channel structure upon exposure of the hGAA or FinFET channel.

Figure 11:
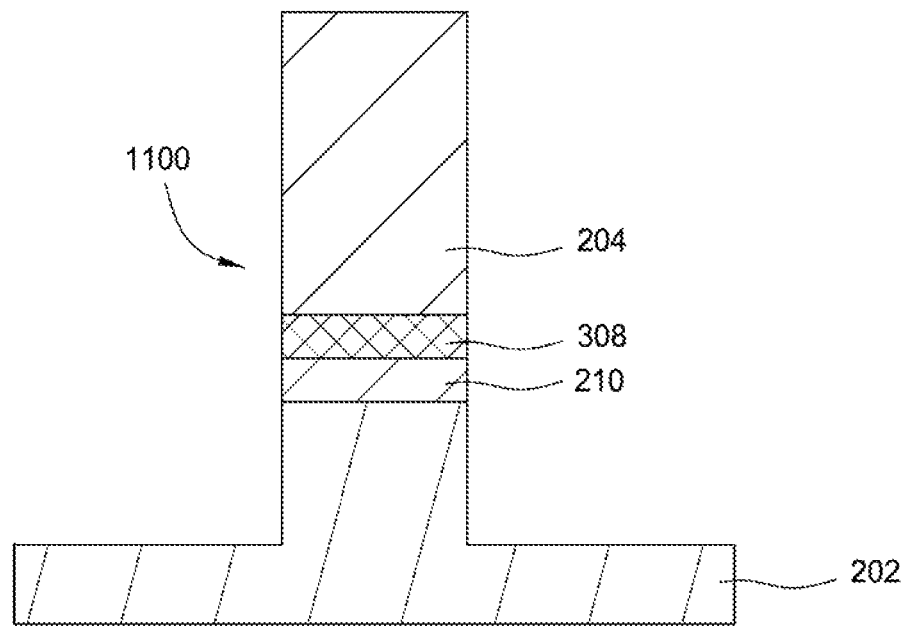
FIG. 11 illustrates a schematic, cross-sectional view of a device structure which may be formed and/or implemented in a device according to embodiments described herein.

FIG. 11 schematically illustrates a cross-sectional view of a device structure 1100 formed and/or implemented in a device according to embodiments described herein. The device structure 1100 is generally considered an additional embodiment of a superlattice structure as defined above. In one embodiment, the device structure 1100 is formed on the substrate 202. In one embodiment, the device structure 1100 includes the material layer 210 disposed on the substrate 202, the BOX layer 308 disposed on the material layer 210, and a single first layer 204 disposed on the BOX layer 308. In another embodiment, the device structure 1100 includes the BOX layer 308 disposed directly on the substrate 202 and the single first layer 204 disposed on the BOX layer 308. In this embodiment, the material layer 210 is not present between the substrate 202 and the BOX layer 308.

Materials suitable for forming the single first layer 204 include silicon containing materials, such as pure silicon and doped silicon materials. Other materials suitable for forming the single first layer 204 include silicon germanium materials. For example, the silicon germanium materials comprise between about 20% and about 40% germanium and between about 60% and about 80% silicon. It is contemplated that the device structure 1100 may be utilized advantageously in FinFET integration schemes. In one embodiment, the device structure 1100 is processed according to the operations described in FIG. 1 and FIGS. 3-7. The device structure 1100 may also be implemented according to the disclosure of FIGS. 8-9 without processing operations directed to replacement of the plurality of second layers 206.

Figure 12:
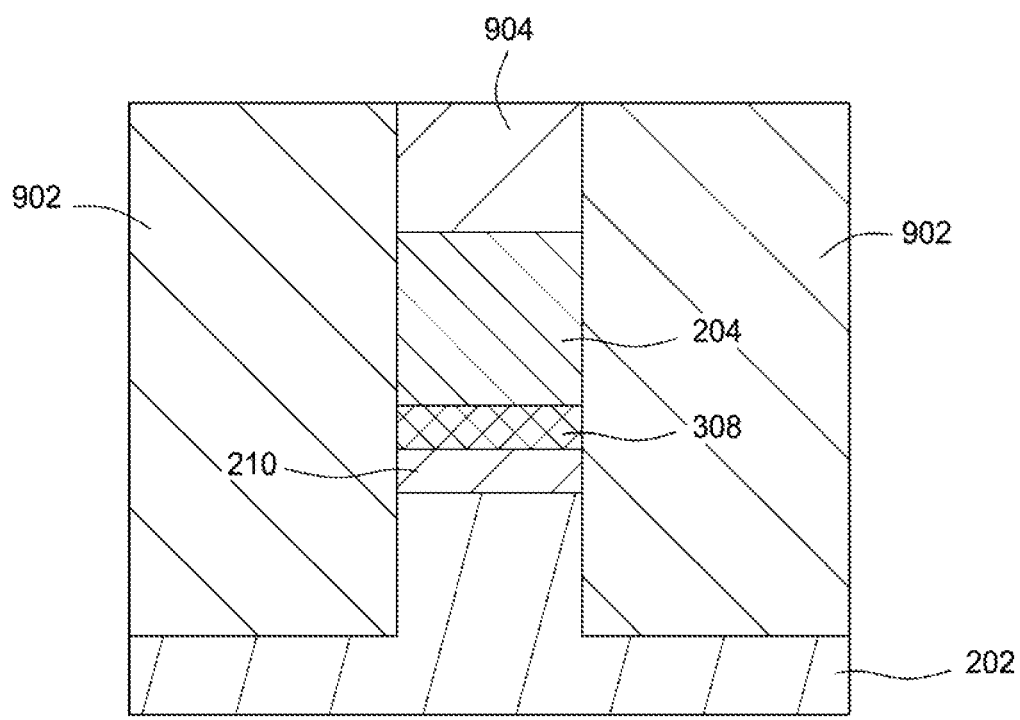
FIG. 12 illustrates a schematic, cross-sectional view of a device incorporating the device structure of FIG. 11.

FIG. 12 illustrates a schematic, cross-sectional view of a device incorporating the device structure 1100 of FIG. 11. As shown, the device structure 1100 may be processed according to the disclosure of FIGS. 8-9 as described above to form a device including the source/drain regions 902 and the metal gate structure 904. It is contemplated that the embodiments described with regard to FIG. 12 may be advantageously implemented with regard to forming a FinFET type device while the embodiments described with regard to FIG. 9 may be advantageously implemented with regard to forming an hGAA type device. However, embodiments from both FinFET and hGAA schemes may be utilized alone or in combination for form device structures which exhibit improved process flexibility in forming the BOX layer 308 and provide for more efficient BOX layer formation and improved device performance.

While the foregoing is directed to embodiments of the present disclosure, other and further embodiments of the disclosure may be devised without departing from the basic scope thereof, and the scope thereof is determined by the claims that follow.

What is claimed is:
1. A device structure, comprising:
  a substrate;
  a channel structure formed on the substrate, the channel structure having one or more silicon material layers, one or more silicon germanium material layers comprising between about 20% and about 40% germanium, and a buried oxide layer, wherein the silicon material layers, the silicon germanium material layers, and the buried oxide layer are disposed in a stacked arrangement.
2. The device structure of claim 1, wherein the buried oxide layer is disposed between the silicon germanium material layers in the stacked arrangement.
3. The device structure of claim 2, further comprising:
  a liner formed on sidewalls of the channel structure, wherein the liner is an oxynitride material, a silicon nitride material, or combinations thereof.
4. A device structure, comprising:
  a channel structure having one or more silicon material layers, one or more silicon germanium material layers comprising between about 20% and about 40% germanium, and a buried oxide layer, wherein the silicon material layers, the silicon germanium material layers, and the buried oxide layer are disposed in a stacked arrangement.
5. The device structure of claim 4, wherein the buried oxide layer is disposed between the silicon germanium material layers in the stacked arrangement.
6. The device structure of claim 5, further comprising:
  a liner formed on sidewalls of the channel structure, wherein the liner is an oxynitride material, a silicon nitride material, or combinations thereof.
7. The device structure of claim 4, further comprising:
  a liner formed on sidewalls of the channel structure.
8. The device structure of claim 7, wherein the liner is an oxynitride material, a silicon nitride materials, or combinations thereof.
9. A device structure, comprising:
  a substrate;
  a channel structure formed on the substrate, the channel structure having one or more silicon material layers, one or more silicon germanium material layers comprising between about 20% and about 40% germanium, and a buried oxide layer, wherein the silicon material layers, the silicon germanium material layers, and the buried oxide layer are disposed in a stacked arrangement;
  source/drain regions formed on the substrate; and
  a metal gate structure formed over the channel structure.
10. The device structure of claim 9, wherein the buried oxide layer is disposed between the silicon germanium material layers in the stacked arrangement.
11. The device structure of claim 9, further comprising:
  a liner formed on sidewalls of the channel structure, wherein the liner is an oxynitride material, a silicon nitride material, or combinations thereof.
12. A device structure, comprising:
  a substrate;
  a channel structure having a buried oxide layer disposed on and in contact with the substrate and a silicon layer or silicon germanium layer comprising between about 20% and about 40% germanium disposed on the buried oxide layer;
  source/drain regions formed on the substrate; and
  a metal gate structure formed over the silicon layer or silicon germanium layer.
13. The device structure of claim 12, wherein the source/drain regions are formed from a material selected from the group consisting of silicon, phosphorous doped silicon, silicon germanium, germanium, and combinations thereof.

14. The device structure of claim 12, wherein the metal gate structure is formed from a materials selected from the group consisting of hafnium dioxide, zirconium dioxide, titanium dioxide, titanium nitride, titanium aluminide, nitride materials, and combinations thereof.

* * * * *